(12) United States Patent
Komatsu et al.

(10) Patent No.: US 8,049,190 B2
(45) Date of Patent: Nov. 1, 2011

(54) ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

(75) Inventors: Kazunori Komatsu, Odawara (JP); Toshihiro Usa, Odawara (JP)

(73) Assignee: Fujifilm Corporation, Tokyo (JP)

( * ) Notice: Subject to any disclaimer, the term of this patent is extended or adjusted under 35 U.S.C. 154(b) by 429 days.

(21) Appl. No.: 12/410,786

(22) Filed: Mar. 25, 2009

(65) Prior Publication Data
US 2009/0242788 A1    Oct. 1, 2009

(30) Foreign Application Priority Data

Mar. 26, 2008   (JP) .................................. 2008-079725

(51) Int. Cl.
*G03C 5/00*   (2006.01)

(52) U.S. Cl. ............. 250/492.22; 250/492.1; 250/492.2; 250/492.3

(58) Field of Classification Search ............... 250/492.1, 250/492.2, 492.22, 492.3; 430/296, 942
See application file for complete search history.

(56) References Cited

U.S. PATENT DOCUMENTS

| 4,980,567 A * | 12/1990 | Yasuda et al. ................. 250/398 |
| 6,503,671 B1 * | 1/2003 | Nakajima ........................ 430/30 |
| 7,026,098 B2 * | 4/2006 | Komatsu et al. .............. 430/296 |

FOREIGN PATENT DOCUMENTS

| JP | 2004177783 A * | 6/2004 |
| JP | 2006-184924 | 7/2006 |

* cited by examiner

*Primary Examiner* — Michael Maskell
(74) *Attorney, Agent, or Firm* — Young & Thompson

(57) ABSTRACT

When writing the shapes of elements of a fine pattern on a substrate by microscopically vibrating the electron beam back and forth in a radial direction of the substrate or in a direction orthogonal to the radial direction and deflecting the electron beam in a direction orthogonal to the vibration direction to scan the electron beam so as to completely fill the shapes of the elements, a proximity-effect correction is performed according to the arrangement density of the elements in which the amount of dose is adjusted by setting the deflection speed faster for the writing of an element in a densely arranged region than for the writing of an identical element in a sparsely arranged region.

9 Claims, 6 Drawing Sheets

FIG.5A FIDUCIAL WRITING

FIG.5B Def(Y) 0 Y DIRECTION DEFLECTION 0 (−)

FIG.5C Def(X) (+) X DIRECTION DEFLECTION 0 (−)

FIG.5D Mod(X) VIBRATION

FIG.5E BLK OFF/ON

FIG.5F WRITING CLOCK SIGNAL

FIG.5G REFERENCE CLOCK SIGNAL

ELECTRON BEAM WRITING METHOD, FINE PATTERN WRITING SYSTEM, METHOD FOR MANUFACTURING UNEVEN PATTERN CARRYING SUBSTRATE, AND METHOD FOR MANUFACTURING MAGNETIC DISK MEDIUM

BACKGROUND OF THE INVENTION

1. Field of the Invention

The present invention relates to an electron beam writing method and a fine pattern writing system for writing a fine pattern according to a desired uneven pattern when manufacturing an imprint mold, magnetic transfer master substrate, or the like for a high density magnetic recording medium, such as a discrete track medium, bit pattern medium, or the like.

The invention also relates to a method for manufacturing an uneven pattern carrying substrate, including an imprint mold, magnetic transfer master substrate or the like, having an uneven pattern surface formed through a writing step performed by the electron beam writing method described above. The invention further relates to a method for manufacturing a magnetic disk medium having an uneven pattern transferred thereto from the uneven pattern carrying substrate or imprint mold, and a method for manufacturing a magnetic disk medium having a magnetized pattern transferred thereto from the magnetic transfer master substrate.

2. Description of the Related Art

Generally, information patterns, such as servo patterns and the like are formed on current magnetic disk media. In view of the demand of higher recording density, a discrete track medium (DTM) in which magnetic interference between adjacent data tracks is reduced by separating the tracks with a groove pattern (guard band) has been attracting wide attention. A bit pattern medium (BPM) proposed for achieving still higher density is a medium in which magnetic substances forming single magnetic domains (single-domain particles) are physically isolated and disposed regularly, and one bit is recorded in one particle.

Heretofore, fine patterns, such as servo patterns and the like, have been formed on magnetic media by uneven patterns, magnetic patterns, or the like and an electron beam writing method for patterning a predetermined fine pattern on a master of a magnetic transfer master substrate or the like has been proposed. In the electron beam writing method, a pattern is written on a substrate applied with a resist by irradiating thereon an electron beam corresponding to the shape of the pattern while rotating the substrate as described, for example, in U.S. Pat. No. 7,026,098 and Japanese Unexamined Patent Publication No. 2006-184924.

The electron beam writing method described in U.S. Pat. No. 7,026,098 is a method in which when, for example, writing a rectangular or parallelogram element constituting a servo pattern extending in a tack width direction, the electron beam is deflected in a radial direction while being vibrated rapidly in a circumferential direction, thereby scanning the beam so as to completely fill the area of the element.

The electron beam writing method described in Japanese Unexamined Patent Publication No. 2006-184924 is a method in which the electron beam is vibrated back and forth in a track width direction of the pattern.

In the mean time, in the electron beam writing methods described above, a pattern shape actually exposed on a resist differs from that written on the substrate by scanning an electron beam due to proximity effect, which depends on the element density of a fine pattern and the exposed shape in a high element density area becomes larger than the written shape, and it is known that it is necessary to perform a proximity-effect correction in which the amount of dose (irradiation dose) is changed.

The proximity effect in the electron beam writing described above is exposure effect to an adjacent writing area due to scattering of the irradiated electron beam, and the impact on a writing pattern varies with the element density of the pattern. That is, when an electron beam is incident on a resist, the beam is broadened by forward scattering as it propagates in the resist toward the substrate. Further, the beam incident on the substrate is scattered, causing backward scattering in which the beam is bounced back from the bottom of the substrate with a large scattering angle. The proximity effect is caused by the fact that the resist is exposed broader than the beam irradiation area by the scattered electrons.

The fine pattern described above is an aggregation of elements, each corresponding to each recording signal, and in a densely arranged region where elements are proximally arranged successively as in the central portion of the aggregation of element arrangement, the proximity effect becomes large due to many scattered electrons involving in the writing of adjacent elements and the amount of dose tends to be excessive. On the other hand, in a sparsely arranged region where only a few elements to be written are arranged around as in a contour portion of the aggregation of element arrangement, the number of impacting scattered electrons is small and the proximity effect becomes small, so that the amount of dose tends to be insufficient. These phenomena become more significant as the resist sensitivity is increased.

If the amount of dose varies according to the element density, when a resist after writing exposure is developed, the exposed resist area to be removed differs from the writing area, whereby an error occurs in the element shape, influencing the forming accuracy of a desired pattern.

Figure 9A:
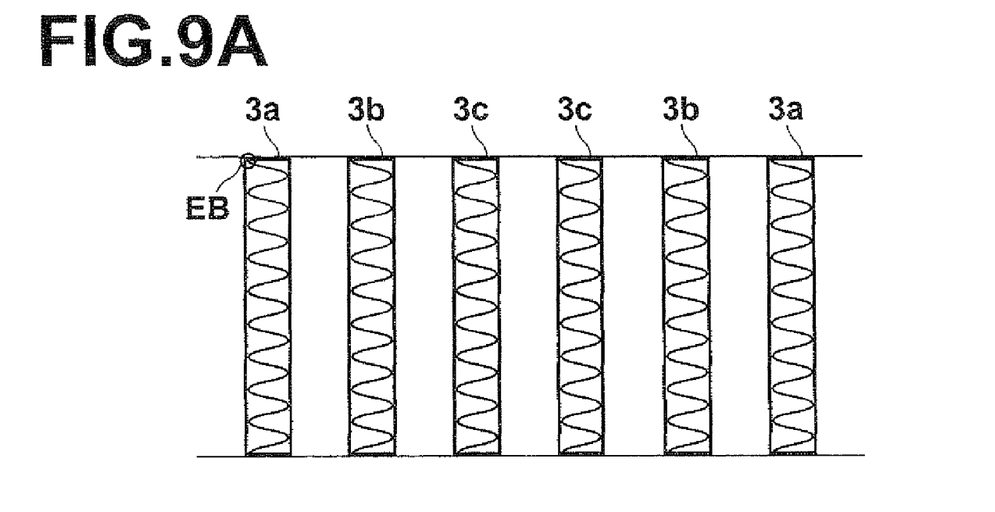
FIG. 9A illustrates an electron beam writing pattern and FIG. 9B illustrates an exposed resist pattern.

For example, as illustrated in FIG. 9A, when six elements 3a to 3c having the same signal length (line width) are written on one track by vibrating electron beam EB back and forth in an element width direction (circumferential direction of the substrate), and if the scattering involving in the writing of one element is assumed to influence two elements on each side of the element, the element arrangement density of each of elements 3a on both ends is a sparsely arranged region which is influenced by the two inner elements, that of each of elements 3b located inner side of elements 3a is an intermediately arranged region which is influenced by the one outer element and two inner elements, and that of each of central elements 3c is a densely arranged region which is affected by two elements on each side.

Figure 9B:
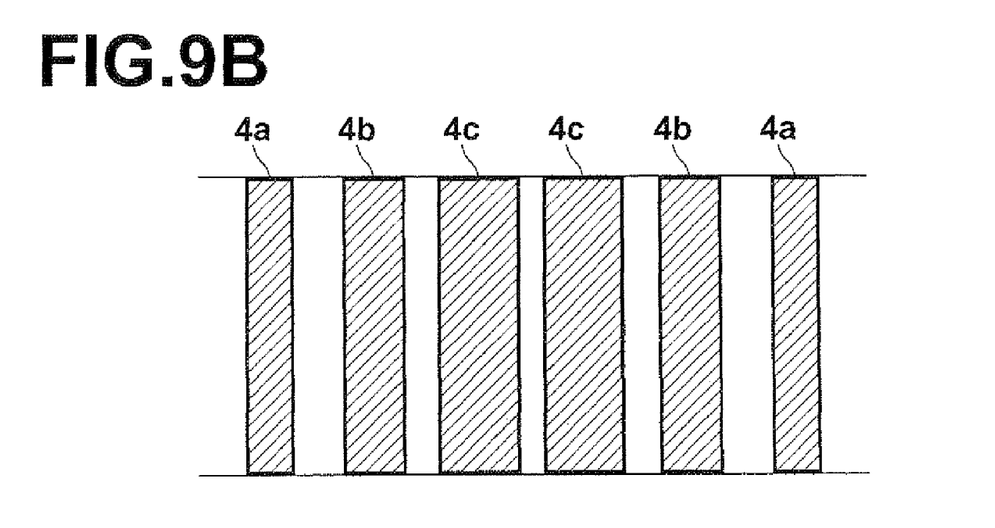

FIG. 9B schematically illustrates an exposed pattern as the result of the electron beam writing shown in FIG. 9A. Where each of elements 4a on both ends has the exposed shape corresponding to the writing width of FIG. 9A from the resist sensitivity and beam intensity, the exposed width of each of elements 4b in the intermediately arranged region becomes larger than the writing width by a predetermined rate, and the exposed width of each of elements 4c in the central densely arranged region becomes further larger than that of elements 4b by a predetermined rate and the element spacing is narrowed. Thus, it is necessary to perform a proximity-effect correction in which the electron beam writing is adjusted for each element so that the actually exposed pattern in FIG. 9B becomes the design pattern shown in FIG. 9A.

The proximity-effect correction in actual electron beam writing has a problem that the setting and write control is complicated.

For example, it is possible to reduce the amplitude of the back and forth vibration of electron beam EB in the circumferential direction in FIG. 9A for the writing of elements 3c so as to be written in narrower lines, whereby a proximity-effect correction may be performed. Fine adjustment of the amplitude for the writing of each element involves changes in the oscillation signal and control difficulties.

In view of the circumstance described above, it is an object of the present invention to provide an electron beam writing method capable of accurately writing a fine pattern, to be formed on a magnetic disk medium, on the entire surface of a substrate in a predetermined manner and rapidly with a constant amount of dose over the entire substrate by enabling an easy proximity-effect correction, and a fine pattern writing system for implementing the electron beam writing method.

It is a further object of the present invention to provide a method for manufacturing an uneven pattern carrying substrate, such as an imprint mold or a magnetic transfer master substrate, having a fine pattern accurately written by an electron beam, and a method for manufacturing a magnetic disk medium using the uneven pattern carrying substrate in which an uneven pattern or a magnetic pattern is transferred from the uneven pattern carrying substrate to the magnetic disk medium.

SUMMARY OF THE INVENTION

An electron beam writing method of the present invention is a method for writing a fine pattern on a substrate applied with a resist and placed on a rotation stage by scanning an electron beam on the substrate while rotating the rotation stage in one direction, the fine pattern including elements larger than an irradiation diameter of the electron beam, wherein:

the elements are written by microscopically vibrating the electron beam back and forth in a radial direction of the substrate or in a direction orthogonal to the radial direction and deflecting the electron beam in a direction orthogonal to the vibration direction to scan the electron beam so as to completely fill the shapes of the elements; and a proximity-effect correction is performed according to the arrangement density of the elements in which the amount of dose is adjusted by setting the deflection speed faster for the writing of an element in a densely arranged region than for the writing of an identical element in a sparsely arranged region.

In the electron beam writing method described above, it is preferable that the rotation of the rotation stage is controlled such that the rotational speed thereof becomes faster for the writing of an inner circumferential track and slower for the writing of an outer circumferential track in inversely proportional to the radius of the writing position, thereby maintaining the linear velocity of the rotation stage constant, a writing control signal of the electron beam is generated based on a writing clock signal which is generated in association with the rotation of the rotation stage and the number of clocks of the writing clock signal in one rotation of the rotation stage is maintained at a constant value for each track regardless of the radius of the writing position, and the writing time in the proximity-effect correction is adjusted by increasing or decreasing an integer number of clocks of the writing clock signal.

Further, when the elements are written by microscopically vibrating the electron beam back and forth in a circumferential direction of the substrate and deflecting the electron beam in a radial direction orthogonal to the vibration direction, the proximity-effect correction for an element in the densely arranged region having the same shape as that of an element in the sparsely arranged region is performed such that the element is written by reducing the writing-ON-time and increasing the deflection speed in the radial direction by an amount corresponding to the reduced amount of the writing-ON-time, thereby reduction correcting the amount of dose.

Still further, when the elements are written by microscopically vibrating the electron beam back and forth in a radial direction of the substrate and deflecting the electron beam in a circumferential direction orthogonal to the vibration direction, the proximity-effect correction for an element in the densely arranged region having the same shape as that of an element in the sparsely arranged region is performed such that the element is written by reducing the writing-ON-time and increasing the speed of the deflection in the circumferential direction by an amount corresponding to the reduced amount of the writing-ON-time, thereby reduction correcting the amount of dose.

A fine pattern writing system of the present invention is a system for realizing the electron beam writing method described above, the system including a signal output unit for outputting a write data signal, and an electron beam writing unit for scanning an electron beam.

Preferably, the fine pattern writing system is structured in the following manner. That is, the electron beam writing unit includes a rotation stage movable in a radial direction while rotating a substrate applied with a resist, an electron gun that emits an electron beam, a deflection means that X-Y deflects the electron beam in a radial direction of the rotation stage and a direction orthogonal to the radial direction and rapidly vibrates the electron beam in the radial direction or in the direction orthogonal to the radial direction, a blanking means that blocks the radiation of the electron beam other than a writing area, and a controller that performs associated control of operation of each of the means. The signal output unit is a unit that outputs a write data signal to the controller of the electron beam writing unit based on data corresponding to the form of a fine pattern to be written on the substrate. Here, the controller performs control based on a writing signal which is created based on writing data of the fine pattern to cause a proximity-effect correction to be performed according to the arrangement density of the elements in which the amount of dose is adjusted by setting the deflection speed faster for the writing of an element in a densely arranged region than for the writing of an identical element in a sparsely arranged region.

A method for manufacturing an uneven pattern carrying substrate of the present invention is a method including the step of exposing a desired fine pattern on a substrate applied with a resist by the electron beam writing method described above and forming thereon an uneven pattern corresponding to the desired fine pattern. Here, the uneven pattern carrying substrate is a substrate having thereon a desired uneven pattern, such as an imprint mold for transferring the shape of the uneven pattern to a target medium, a magnetic transfer master substrate for transferring a magnetic pattern corresponding to the shape of the uneven pattern to a target medium, or the like.

A first method for manufacturing a magnetic disk medium of the present invention is a method that uses an imprint mold obtained through a step of exposing a desired fine pattern on a substrate applied with a resist by the electron beam writing method described above and forming thereon an uneven pattern corresponding to the desired fine pattern to transfer an uneven pattern corresponding to the uneven pattern formed on the surface of the mold to the medium.

A second method for manufacturing a magnetic disk medium of the present invention is a method that uses a magnetic transfer master substrate obtained through a step of exposing a desired fine pattern on a substrate applied with a resist by the electron beam writing method described above and forming thereon an uneven pattern corresponding to the desired fine pattern to transfer a magnetic pattern corresponding to the uneven pattern formed on the surface of the master substrate to the medium.

According to the electron beam writing method of the present invention, elements are written on a substrate applied with a resist and placed on a rotation stage by scanning an electron beam on the substrate while rotating the substrate in one direction, in which the elements are written by microscopically vibrating the electron beam back and forth in a radial direction or in a direction orthogonal to the radial direction and deflecting the beam in a direction orthogonal to the vibration direction to scan the electron beam so as to completely fill the elements and a proximity-effect correction is performed according to the arrangement density of the elements in which the amount of dose is adjusted by setting the deflection speed faster for the writing of an element in a densely arranged region than for the writing of an identical element in a sparsely arranged region. Thus, the proximity-effect control may be performed accurately by simple control and an exactly designed fine pattern may be written rapidly and highly accurately over the entire surface of the substrate, resulting in improved writing efficiency and reduced writing time.

Where rotation control of the rotation stage is performed such that the rotational speed thereof becomes faster for the writing of an inner circumferential track and slower for the writing of an outer circumferential track in inversely proportional to the radius of the writing position, thereby maintaining the linear velocity of the rotation stage constant, a writing control signal of the electron beam is generated based on a writing clock signal which is generated in association with the rotation of the rotation stage, and the number of clocks of the writing clock signal in one revolution of the rotation stage is maintained at a constant value for each track regardless of the radius of a writing position, and the adjustment of writing time in the proximity-effect control is performed by increasing or decreasing an integer number of clocks of the writing clock signal, control according to the radial position may be performed easily and highly accurately in addition to easy and accurate proximity-effect control.

In the mean time, the fine pattern writing system for realizing the electron beam writing method of the present invention includes a signal output unit for outputting a write data signal and an electron beam writing unit for scanning an electron beam, so that a desired fine pattern may be written rapidly and highly accurately, resulting in improved writing efficiency and reduced writing time.

In particular, a preferable system as the fine pattern writing system may be built in the following manner. That is, the electron beam writing unit includes a rotation stage movable in a radial direction while rotating a substrate applied with a resist, an electron gun that emits an electron beam, a deflection means that X-Y deflects the electron beam in a radial direction of the rotation stage and a direction orthogonal to the radial direction and rapidly vibrates the electron beam in the radial direction or in the direction orthogonal to the radial direction, a blanking means that blocks the radiation of the electron beam other than a writing area, and a controller that performs associated control of operation of each of the means The signal output unit is a unit that outputs a write data signal to the controller of the electron beam writing unit based on data corresponding to the form of a fine pattern to be written on the substrate. Here, the controller performs control based on a writing signal which is created based on writing data of the fine pattern to cause a proximity-effect correction to be performed according to the arrangement density of the elements in which the amount of dose is adjusted by setting the deflection speed faster for the writing of an element in a densely arranged region than for the writing of an identical element in a sparsely arranged region.

According to the method for manufacturing an uneven pattern carrying substrate of the present invention, the method includes the step of exposing a desired fine pattern on a substrate applied with a resist by the electron beam writing method described above and forming an uneven pattern thereon corresponding to the desired fine pattern. Thus, a substrate having thereon a highly accurate uneven pattern may be obtained easily.

According to the first method for manufacturing a disk medium of the present invention, a magnetic disk medium is manufactured using an imprint mold obtained through the steps of exposing a desired fine pattern on a substrate applied with a resist by the electron beam writing method described above and forming thereon an uneven pattern corresponding to the desired fine pattern to transfer an uneven pattern corresponding to the uneven pattern provided on the surface of the mold to the magnetic disk medium. In the case of the imprint mold, when performing shape patterning using imprint technology, the mold is pressed onto the surface of a resin layer serving as a mask in the manufacturing process of the magnetic disk medium and the pattern is transferred to the surface of the medium at a time, whereby a magnetic disk medium having excellent properties, such as a discrete track medium or a bit pattern medium, may be manufactured easily.

According to the second method for manufacturing a disk medium of the present invention, a magnetic disk medium is manufactured using a magnetic transfer master substrate obtained through the steps of exposing a desired fine pattern on a substrate applied with a resist by the electron beam writing method described above and forming thereon an uneven pattern corresponding to the desired fine pattern to magnetically transfer a magnetic pattern corresponding to the uneven pattern formed on the surface of the master substrate to the magnetic disk medium. In the case of the magnetic transfer master substrate, the substrate has thereon a fine pattern of a magnetic layer, so that a magnetic recording medium having excellent properties may be manufactured easily by bringing the master substrate into contact with the magnetic recording medium and applying a magnetic field thereto using magnetic transfer technology, and transfer forming a magnetic pattern corresponding to the pattern of the magnetic layer of the master substrate on the magnetic recording medium.

BRIEF DESCRIPTION OF THE DRAWINGS

FIGS. 9A and 9B illustrate proximity effects, in which

DESCRIPTION OF THE PREFERRED EMBODIMENTS

Figure 1:
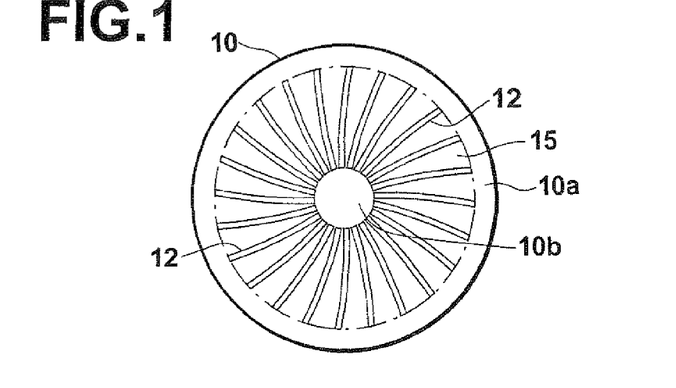
FIG. 1 illustrates an example fine pattern in plan view to be written on a substrate by an electron beam writing method of the present invention.
Figure 2:
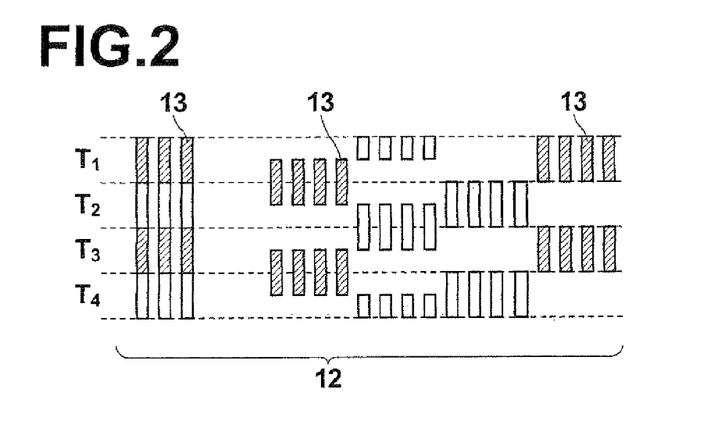
FIG. 2 is a partially enlarged view of the fine pattern.
Figure 3:
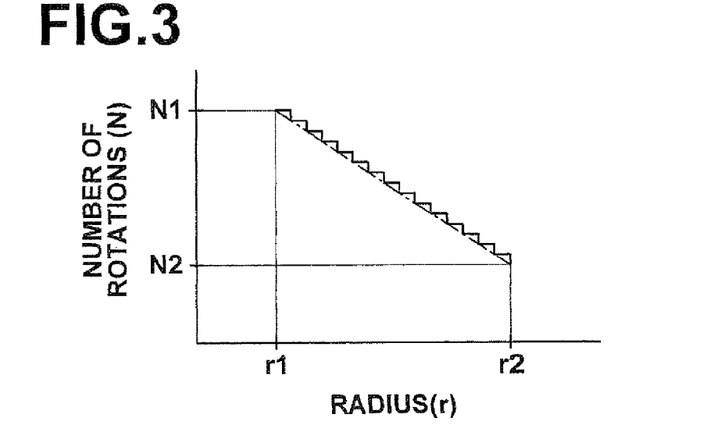
FIG. 3 is a characteristic view illustrating the relationship between the radius of the writing position and rotational speed of a substrate.
Figure 4A:
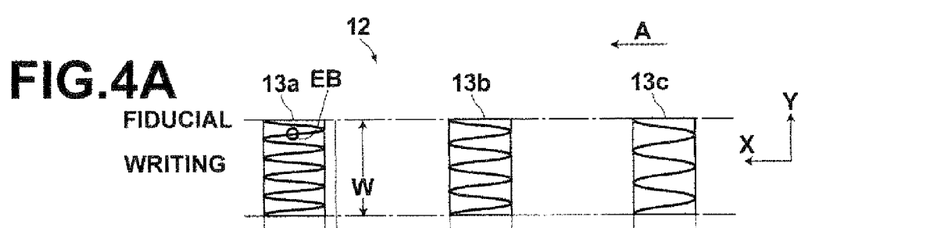
FIG. 4A is an enlarged schematic view illustrating a first writing mode which includes correction of proximity effects of fine pattern elements.
Figure 5A:
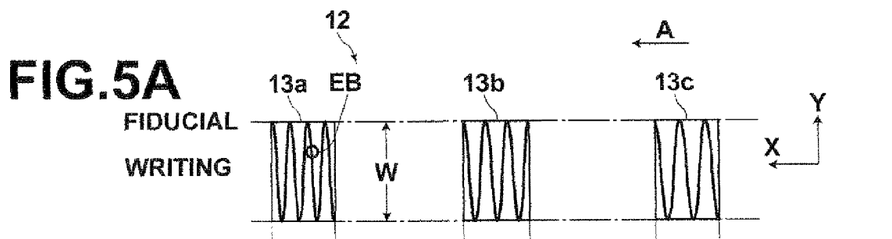
FIG. 5A is an enlarged schematic view of a second writing mode which includes correction of proximity effects of fine pattern elements.
Figure 5B:
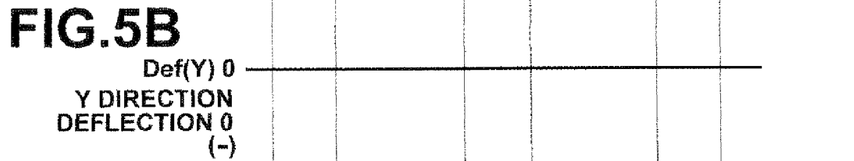
FIGS. 5B to 5G illustrate various signals, including a deflection signal and the like, used in the second writing mode shown in FIG. 5A.
Figure 5C:
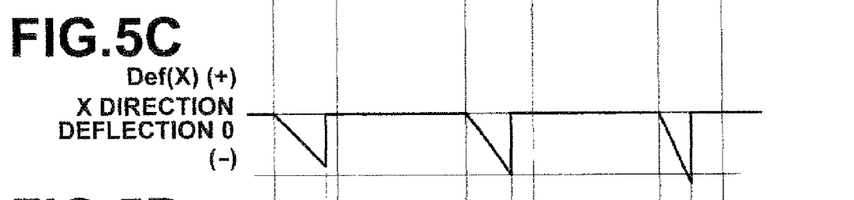
Figure 5D:
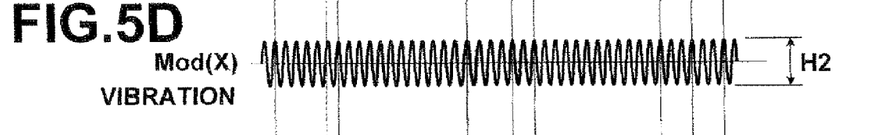
Figure 5E:
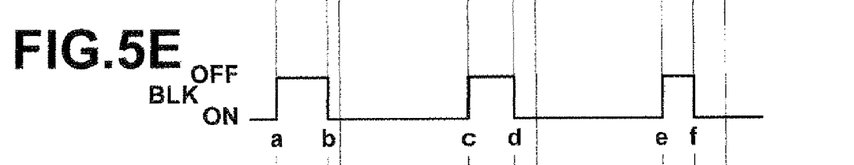
Figure 5F:
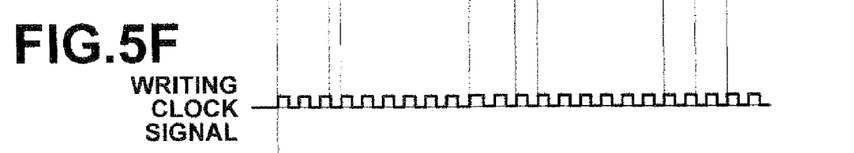
Figure 5G:
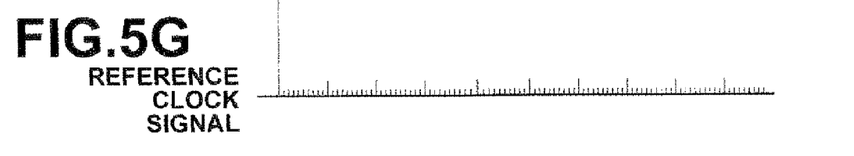
Figure 6A:
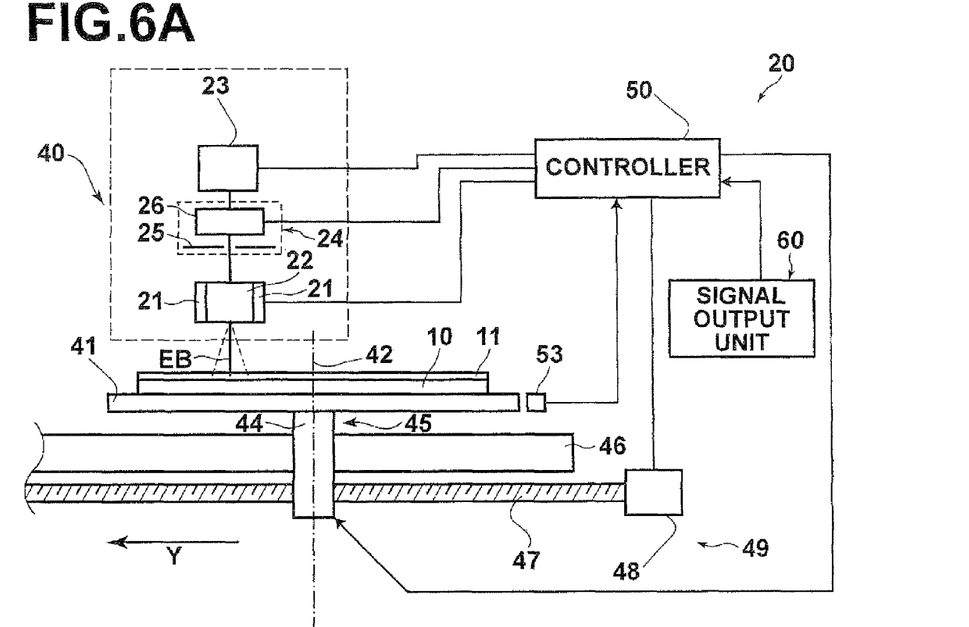
FIG. 6A is a relevant side view of a fine pattern writing system according to an embodiment for implementing the electron beam writing method of the present invention.
Figure 6B:
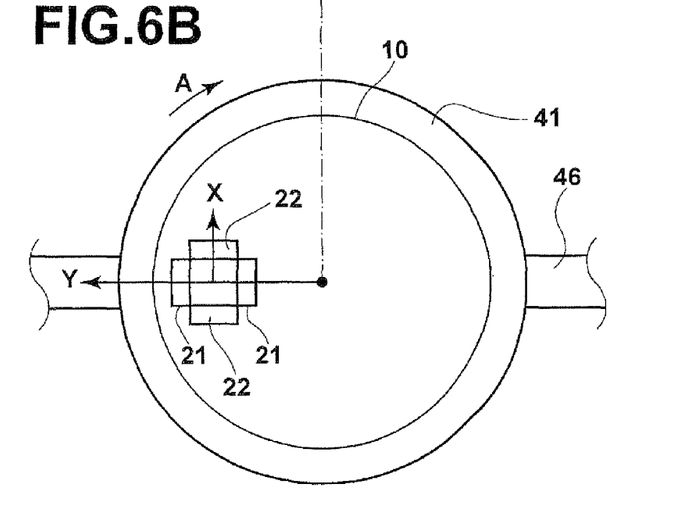
FIG. 6B is a partial plan view of the fine pattern writing system shown in FIG. 6A.

Hereinafter, exemplary embodiments of the present invention will be described in detail with reference to the accompanying drawings. FIG. 1 illustrates an example fine pattern in plan view to be written on a substrate by an electron beam writing method of the present invention. FIG. 2 is a partially enlarged view of the fine pattern. FIG. 3 is a graph illustrating the relationship between the radius of the writing position and rotational speed of a substrate. FIG. 4A is an enlarged schematic view illustrating a first writing mode which includes correction of proximity effects of fine pattern elements, and FIGS. 4B to 4G illustrate various signals, including a deflection signal and the like, used in the first writing mode shown in FIG. 4A. FIG. 5A is an enlarged schematic view illustrating a second writing mode which includes correction of proximity effects of fine pattern elements, and FIGS. 5B to 5G illustrate various signals, including a deflection signal and the like, used in the second writing mode shown in FIG. 5A. FIG. 6A is a relevant side view of a fine pattern writing system according to an embodiment for implementing the electron beam writing methods of the present invention, and FIG. 6B is a partial plan view of the fine pattern writing system shown in FIG. 6A.

As illustrated in FIGS. 1 and 2, a fine pattern of fine uneven shapes for a magnetic disk medium includes servo patterns 12 formed in a plurality of servo areas, and data area 15 is provided between servo areas 12. The fine pattern is formed on an annular region of disk-shaped substrate 10 (circular substrate) excluding outer circumferential portion 10a and inner circumferential portion 10b.

Servo patterns 12 are formed in elongated areas substantially radially extending from the center to each sector on concentric tracks of substrate 10 at regular intervals. In this example, servo patterns 12 are formed in contiguous curved radials in the radial direction. As shown in FIG. 2, which is a partially enlarged view of the servo patterns, fine rectangular servo elements 13 corresponding, for example, to preambles address, and burst signals are disposed on concentric tracks T1 to T4. One servo element 13 has a width of one track width and a track direction length greater than the irradiation diameter of the electron beam. Some of servo elements 13 of burst signals are shifted by a half track width and extending over the adjacent track.

In the case of the first writing mode shown in FIG. 4A, servo elements 13 for one track are written during one rotation of substrate 10. When first track T1 or third track T3 shown in FIG. 2 is written, hatched elements 13 are sequentially written. Servo elements 13 shifted by a half track width and extend over adjacent track T2 or T3 are written at a time by shifting the writing fiducial by a half track width without dividing them into halves.

For a discrete track medium, which has received attention in recent years, groove patterns extending in the track direction are concentrically formed in a guard band section between each data track in data areas 15 so as to separate each of adjacent tracks T1 to T4 by the grooves, in addition to servo patterns 12. The groove patterns are written by separate write control.

When writing each servo element 13 of each servo pattern 12, substrate 10 applied with resist 11 is placed on rotation stage 41 (FIG. 6) to be described later, and while substrate 10 is rotated, elements 13 are sequentially scanned with electron beam EB to radiation expose resist 11 one track at a time from a track on the inner circumferential side to a track on the outer circumferential side or vice versa.

FIG. 3 illustrates the relationship between the number of rotations N and radius r of substrate 10 in the writing on an inner circumferential track and on an outer circumferential track in pattern writing on substrate 10. In the basic characteristic represented by the chain line, rotation control is performed such that the number of rotations N2 for the outermost track (radius r2) is decreased in inversely proportional to the radius with respect to the number of rotations N1 for the innermost track (radius r1). In practice, the number of rotations N is not change-controlled for each track, but the rotation control is performed in a stepwise manner when rotation stage 41 is mechanically moved in the radial direction after a plurality of tracks (e.g., 8 tracks) is written according to the deflectable range of electron beam EB in the radial direction to change the number of rotations N of rotation stage 41 in association with the mechanical movement thereof, as shown by the solid line.

In this way, the number of rotations N of rotation stage 41 is controlled so as to be decreased when an outer circumferential track is written and increased when t an inner circumferential track is written in order to maintain the linear velocity constant over the entire writing area of substrate 10 including an inner side region and an outer side region when a writing region in the writing area of substrate 10 is moved in the radial direction, that is, with respect to track migration. This is advantageous since a uniform amount of dose including proximity-effect correction and accuracy of the writing position may be ensured in the writing by electron beam EB.

FIGS. 4A to 4G illustrate a first writing mode of the electron beam writing method of the present invention. In the present embodiment, servo elements 13a, 13b, and 13c of servo pattern 12 are written at a time during one rotation of substrate 10 (rotation stage 41), including proximity-effect correction, to be described later. That is, while substrate 10 is unidirectionally rotated in A direction, servo elements 13a to 13c are sequentially written at a time at predetermined phase positions on concentric tacks (track width: W) which, when viewed microscopically, extends linearly by scanning electron beam EB having a small diameter so as to completely fill the shapes thereof.

Where FIGS. 4A to 4G illustrate the writing on an inner circumferential track, the lengths of servo elements 13a to 13c in the track direction are small, whereas in the writing on an outer circumferential track, the lengths of servo elements 13a to 13c in the track direction are increased as the circumferential length increases, although track width W is not changed. In both cases, signals read out from corresponding one of servo elements 13a to 13c are the same when rotationally driven as a finished product of magnetic disk medium.

The recording mode of servo patterns 12 described above is a constant angular velocity (CAV) mode, in which writing is performed such that the length of element 13 in the track direction is long on a track on the outer circumferential side and short on a track on the inner circumferential side according to the variation in the sector length between the inner and outer circumferences.

The scanning of electron beam EB is performed in the following manner. That is, while electron beam EB having a smaller beam diameter than a minimum track direction length of servo elements 13a to 13c is irradiated through ON/OFF operation of blanking means 24, to be described later, according to the writing area, electron beam EB is X-Y deflected in radial direction Y and circumferential direction X orthogonal to radial direction Y and rapidly vibrated back and forth in circumferential direction X at a constant amplitude according to the rotational linear speed of substrate 10 (rotation stage 41) as shown in FIG. 4A. In this way, electron beam EB is scanned so as to completely fill servo elements 13a to 13c, whereby the elements are written. For servo elements extending over the adjacent track, the writing fiducial in radial direction Y is shifted by a half track width from that of the writing of in-track servo elements and writing is performed in the same manner as described above.

The proximity-effect correction in the writing mode shown in FIGS. 4A to 4G is performed in the following manner. The three servo elements, namely servo elements 13a to 13c, are written in the same shape, in which element 13a on the left side is an element in a sparsely arranged region, element 13b in the center is an element in a normally arranged region which does not require the proximity-effect correction, and element 13c on the right is an element in a densely arranged region. For these elements, the proximity-effect correction is performed by setting the deflection signal and blanking signal based on a writing clock signal, to be described later, such that the deflection speed in radial direction Y for element 13a in the sparsely arranged region becomes slower and that for element 13c in the densely arranged region becomes faster with respect to the deflection speed in radial direction Y for element 13b in the normally arranged region. The amount of dose for element 13a in the sparsely arranged region is increased and that for element 13c is decreased by the deflection speed control described above.

Figure 4B:
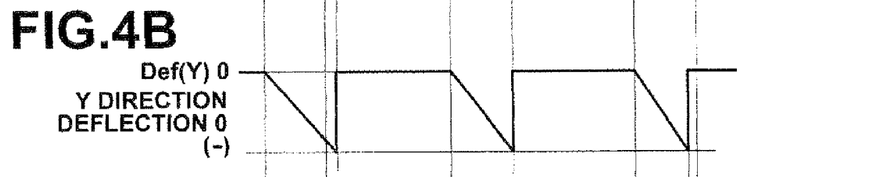
FIGS. 4B to 4G illustrate various signals, including a deflection signal and the like, used in the first writing mode shown in FIG. 4A.
Figure 4C:
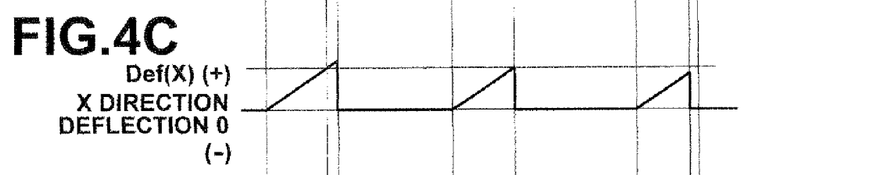
Figure 4D:
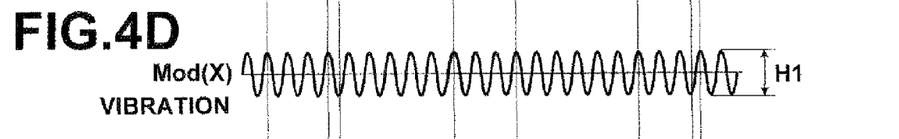
Figure 4E:
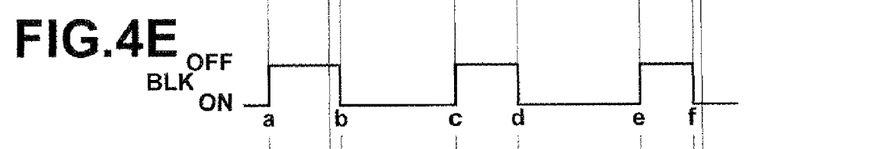
Figure 4F:
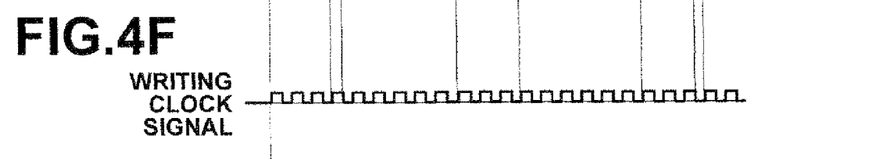
Figure 4G:
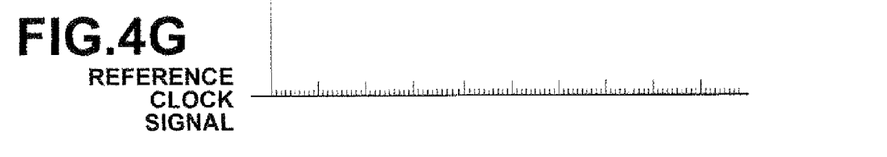

FIG. 4A illustrates the writing operation of electron beam EB in radial direction Y and circumferential direction X (rotational direction A), FIG. 4B illustrates deflection signal Def(Y) in radial direction Y, FIG. 4C illustrates deflection signal Def(X) in circumferential direction X, FIG. 4D illustrates vibration signal Mod(X) in circumferential direction X, FIG. 4E illustrates ON/OFF operation of blanking signal BLK, FIG. 4F illustrates a writing clock signal, and FIG. 4G illustrates a constant reference clock signal. The horizontal axis of FIG. 4A represents the phase of substrate 10, and those of FIGS. 4B to 4G represent time.

The reference clock signal shown in FIG. 4G is a constant clock signal, which does not change under any circumstances, generated in controller 50, to be described later. The writing clock signal shown in FIG. 4F is based on the reference clock signal, and the clock width (clock length) is controlled according to a change in the number of rotations N such that the number of clocks per rotation of rotation stage 41 remains the same even when the number of rotations N of rotation stage 41 is changed between the time when an inner circumferential track is written and the time when an outer circumferential track is written as illustrated in FIG. 3.

That is, the clock width is changed according to radius r for every predetermined number of tracks so as to become narrow on inner circumferential tracks and wide on outer circumferential tracks. Then, as the basis, the dimensional and temporal widths in circumferential direction X (rotational direction A) are defined by the number of clocks of the writing clock signal and each of servo elements 13a to 13c is written with the same number of clocks. This causes the number of writing clocks to become the same between the inner and outer circumferential sides at the same angle (phase), whereby analogous patterns may be written easily. Unlike the above, where the clock width is maintained the same between the inner and outer circumferences, the width of an element on a certain track may not possibly correspond to an integer multiple of the clock width, whereas, in the present invention, the element width is always maintained to an integer multiple of the clock width so that servo elements with subtly changing pattern widths may be written easily.

Further, an integer number of clocks are increased or decreased according to the proximity-effect correction described above. In the case of FIGS. 4A to 4G, the control is performed such that the writing-ON-time of element 13a in the sparsely arranged region is extended by delaying the ON-ending-timing and the writing-ON-time of element 13c in the densely arranged region is reduced by advancing the ON-ending-time in comparison with the writing-ON-time of element 13b in the normally arranged region. In accordance with the blanking control described above, the inclination of deflection signal Def(Y) in radial direction Y shown in FIG. 4B and the magnitude (height) of deflection signal Def(X) in circumferential direction X shown in FIG. 4C are changed.

A first example of writing will now be described in detail with reference to FIGS. 4A to 4G. The basic writing operation of elements 13a to 13c is as follows. First, at points "a", "c", and "e", blanking signal BLK (FIG. 4E) is turned OFF to start writing servo elements 13a to 13c by irradiating electron beam EB. While being vibrated back and forth in circumferential direction X by vibration signal Mod(X) (FIG. 4D), electron beam EB at the fiducial position is deflected by deflection signal Def(Y) (FIG. 4B) and moved in radial direction (−Y), and at the same time deflected and moved in circumferential direction X which is the same direction as A direction by deflection signal Def(X) (FIG. 4C) in order to compensate for displacement of the irradiation position of electron beam EB arising from the rotation of substrate 10 in A direction, whereby electron beam EB is scanned so as to completely fill rectangular servo elements 13a to 13c. Then, at points "b", "d", and "f", blanking signal BLK is turned ON to terminate the irradiation of electron beam EB and the writing of elements 13a to 13c. After the writing is completed, the deflections in radial direction Y and circumferential direction X are returned to the fiducial position. The length of each of servo elements 13a to 13c in circumferential direction is the same, which is defined by amplitude H1 of the back and forth vibration of electron beam EB in the circumferential direction.

The proximity-effect correction is performed by changing ON-timing points (b, and f) of blanking signal BLK in FIG. 4E with respect to that for element 13b in the normally arranged region. For servo element 13a in the sparsely arranged region, ON-timing point "b" is delayed to extend the writing-ON-time, and the deflection speed in Y direction is reduced so that the writing of track width W is completed during this ON-time, that is, the amount of dose is increased by extending the time for writing an area of the same size. More specifically, deflection signal Def(Y) in radial direction Y shown in FIG. 4B is set such that the amount of deflection at point "b" corresponds to that at point "d" of element 13*b* in the normally arranged region, and the amount of deflection of deflection signal Def(X) in circumferential direction X shown in FIG. 4C is increased to point "b" since substrate 10 is rotated more in A direction by the amount of extended time of the writing-ON-time.

In the mean time, for servo element 13*c* in the densely arranged region, point "f" is advanced and the writing-ON-time is reduced, and the deflection speed in Y direction is increased so that the writing of track width W is completed during this ON-time, that is, the amount of dose is decreased by reducing the time for the writing an area of the same size. More specifically, deflection signal Def(Y) in radial direction Y shown in FIG. 4B is set such that the amount of deflection at point "f" corresponds to that at point "d" of element 13*b* in the normally arranged region, and the amount of deflection of deflection signal Def(X) in circumferential direction X shown in FIG. 4C is reduced at point "f" since substrate 10 is rotated less in A direction by the amount of reduced time of the writing-ON-time.

As described above, write control signals shown in FIGS. 4B to 4D are generated based on the writing clock signal shown in FIG. 4F. ON/OFF control of blanking signal BLK shown in FIG. 4E is performed according to the signal generation timing of the writing clock signal and the proximity-effect correction, in which the ON-time is adjusted, is performed by increasing or decreasing an integer number of the clocks.

Note that when writing servo elements 13, accurate positioning is performed at a plurality of writing start points, such as point "a" in FIG. 4E and the like, based on the encoder pulse signal to improve accuracy of the forming position of the servo patterns 12 in one round.

After writing one track for one round is completed, electron beam EB is moved to the next track and the writing is performed in the same manner as described above, whereby desired fine patterns 12 are written over the entire writing area of substrate 10. The track migration of electron beam EB is performed by linearly moving rotation stage 41, to be described later, in radial direction Y. As described above, the movement of the rotation stage may be performed for the writing of every plurality of tracks according to the deflectable range of electron beam EB in radial direction Y or for writing of each track.

Where FIGS. 4A to 4G illustrate the writing on an inner circumferential track, each of the signals shown in FIGS. 4B, 4C, 4E, and 4F is set such that the length of each element in the track direction becomes longer at a predetermined rate when an outer circumferential track is written. The amplitude of the oscillation signal shown in FIG. 4D is increased for element 13 on the outer side at a predetermined rate corresponding to the increased amount of the width of the element in comparison with that for element 13 on the inner side. The reference deflection shifting speed in circumferential direction X and radial direction Y is decreased for writing a track on the outer side and increased for the writing a track on the inner side. In the mean time, the reference clock signal shown in FIG. 4G is generated at constant time intervals and the clock width of the writing clock signal shown in FIG. 4F is controlled according to the radius such that each track has the same number of clocks based on the reference clock signal. That is, the clock width is increased at the similar rate to that of the signals shown in FIGS. 4B to 4F. Then, ON and OFF timings of each control signal and signal shape are set by counting the number of clocks of the writing clock signal. For example, it is preferable that servo elements 13 of servo pattern 12 be written at a rate of 10 to 30 clocks. Where the writing area of servo element 13 is increased, the influence of proximity effects tends to become small, so that the proximity-effect correction coefficient differs from that of the inner side writing.

As described above, the clock width of the writing clock signal becomes wide in an outer circumferential track and narrow in an inner circumferential track while the number of rotations N of rotation stage 41 becomes small in an outer circumferential track and large in an inner circumferential track, which are changed at the same time in synchronization with each other. A slight change in the writing track position, that is, radial position r during the same number of rotations N does not change the number of clocks in one rotation, so that elements having substantially the same shape may be written at the same phase position through control by the same number of writing clocks. Here, the relative moving speed of resist 11 with respect to electron beam EB differs depending on the radial position and becomes slightly faster in an outer circumference, whereby the amount of dose of unit area is changed. But, the signal widths of the written elements depend on the amplitude of the oscillation signal shown in FIG. 4D, so that they become substantially the same, and slight change in the writing track position may be compensated for by the sensitivity of the resist, signal accuracy, and the like without changing the number of rotations N and the width of the writing clock signal. Therefore, these signals can be actually used as recorded information without any problem and it is not necessary to perform change control of the number of rotations N and writing clock width for the writing of each track but, for example, the writing of every 8 tracks as described above.

The intensity of electron beam EB is set to a value which is sufficient to expose servo elements 13 by the rapid vibration writing.

Next, an embodiment of a second writing mode of the present invention will be described based on FIGS. 5A to 5G. FIG. 5A illustrates writing operation of electron beam EB in radial direction Y and circumferential direction X of substrate 10. FIG. 5B illustrates deflection signal Def(Y) in radial direction Y, FIG. 5C illustrates deflection signal Def(X) in circumferential direction X, FIG. 5D illustrates vibration signal Mod(Y) in radial direction Y, FIG. 5E illustrates ON/OFF operation of blanking signal BLK, FIG. 5F illustrates a writing clock signal, and FIG. 5G illustrates a constant basic signal. The horizontal axis of FIG. 5A represents the phase of substrate 10, and those of FIGS. 5B to 5G represent time.

The second writing mode is a modification of the first writing mode, in which the back and forth vibration in circumferential direction X in the first writing mode is changed to back and forth vibration in radial direction Y. While electron beam EB having a smaller beam diameter than a minimum track direction length of servo elements 13*a* to 13*c* is irradiated through ON/OFF operation of blanking means 24, to be described later, according to the writing region, electron beam EB is X-Y deflected in radial direction Y and circumferential direction X orthogonal to radial direction Y and rapidly vibrated back and forth in radial direction Y at a constant amplitude according to the rotational linear velocity of substrate 10 (rotation stage 41) shown in FIG. 5A. In this way electron beam EB is scanned so as to completely fill servo elements 13*a* to 13*c*, whereby the elements are written. Note that deflection signal Def(Y) shown in FIG. 5B is constant and electron beam EB is not deflected in radial direction Y, i.e., fixed.

The deflection in circumferential direction (−X) by deflection signal Def(X) is opposite to rotational direction A and greater in value than rotational linear velocity. Further, it includes an amount of deflection in the same direction as direction A for compensating for a displacement of the irradiation position of electron beam EB arising from the rotation of substrate 10 in direction A during writing. This causes electron beam EB to move forward relative to the rotation of substrate 10, and writing of predetermined lengths are completed at points "b", "d", and "f" before the write end positions of servo elements 13a to 13c reach the write start positions. Where the rotational linear velocity is set constant for an outer circumferential region and an inner circumferential region, the frequency of vibration signal Mod(Y) shown in FIG. 5D is set to a constant value if other compensation elements are not considered.

The proximity-effect correction in the writing mode shown in FIGS. 5A to 5G is performed in the following manner. Servo elements 13a to 13c shown in FIG. 5A are written in the same shape, in which servo element 13a on the left is an element in a sparsely arranged region, central servo element 13b is an element disposed in a normally arranged region that do not require proximity-effect correction, and servo element 13c on the right is an element in a densely arranged region. Proximity effects are corrected by setting the deflection signal and blanking signal such that the deflection speed in circumferential direction X is decreased for servo element 13a in the sparsely arranged region and increased for servo element 13c in the densely arranged region based on a writing clock signal to be described later. The control of the deflection speed in circumferential direction X described above causes the amount of dose to be increased for element 13a in the sparsely arranged region and decreased for element 13c in the densely arranged region.

A second example of writing will be described in detail with reference to FIGS. 5A to 5G. The basic writing operation of elements 13a to 13c is as follows. First, at points "a", "c", and "e", blanking signal BLK (FIG. 5E) is turned OFF to start writing servo elements 13a to 13c by irradiating electron beam EB. While being vibrated back and forth in radial direction Y by vibration signal Mod(Y) (FIG. 5D), electron beam EB at the fiducial position is deflected by deflection signal Def(X) (FIG. 5C) and moved faster than the rotational linear velocity in circumferential direction (−X) which is opposite to rotational direction A, whereby electron beam EB is scanned so as to completely fill rectangular servo elements 13a to 13c. Then at points "b", "d", and "f", blanking signal BLK is turned ON to terminate the irradiation of electron beam EB and writing of elements 13a to 13c. After the writing is completed, the deflection in circumferential direction X is returned to the fiducial position. The length of each of servo elements 13a to 13c in circumferential direction X is the same, and the writing length of each of servo elements 13a to 13c in radial direction Y is defined by the amplitude of the back and forth vibration of electron beam EB in radial direction Y.

The proximity-effect correction is performed by changing ON-timing points (b, and f) of blanking signal BLK in FIG. 5E with respect to that for element 13b in the normally arranged region. For servo element 13a in the sparsely arranged region, ON-timing point "b" is delayed to extend the writing-ON-time, and the inclination of deflection signal Def (X) in FIG. 5C is reduced to reduce the deflection speed in X direction so that the writing of defined element length is completed during this ON-time, that is, the amount of dose is increased by extending the time for writing an area of the same size. The amount of deflection of X deflection signal Def(X) at point "b" in FIG. 5C is set smaller than that of element 13b in the normally arranged region at point "d" since the writing-ON-time is extended and an amount of rotation of substrate 10 is added by that much.

In the mean time, for servo element 13c in the densely arranged region, point "f" is advanced and the writing-ON-time is reduced, and the inclination of deflection signal Def (X) in FIG. 5C is increased to increase the deflection speed in X direction so that the amount of dose is reduced by reducing the time for writing an area of the same size. The amount of deflection of deflection signal Def(X) at point "f" in FIG. 5C is set larger than that of element 13b in the normally arranged region at point "d" since the writing-ON-time is reduced and an amount of rotation of substrate 10 in A direction is reduced by that much.

As described above, ON-time control involving in the proximity-effect correction is performed by ON/OFF control of the blanking signal in FIG. 5E according to the signal generation timing of the writing clock signal and by increasing or decreasing an integer number of the clocks.

Where FIGS. 5A to 5G illustrate the writing on an inner circumferential track, each of the signals shown in FIGS. 5C, 5E, and 5F is set such that the length of each element in the track direction becomes longer at a predetermined rate when an outer circumferential track is written. Vibration signal Mod(Y) shown in FIG. 5D is maintained constant at H2 since track width W is the same between an inner circumferential region and an outer circumferential region. Further, as described above, where the rotational linear velocity of substrate 10 is set constant between an inner circumferential region and an outer circumferential region, the frequency is set to a constant value. The reference deflection shifting amount in circumferential direction X shown in FIG. 5C is set larger for the writing on a track on the outer circumferential side as the length of servo element 13 in the track direction is increased. In the mean time, the reference clock signal shown in FIG. 5G is generated at constant time intervals and the clock width of the writing clock signal shown in FIG. 5F is controlled according to the radius such that each track has the same number of clocks based on the reference clock signal. That is, the clock width is increased at the similar rate to that of the signals shown in FIGS. 5C to 5E. Then, the proximity-effect correction by the increase or decrease of the ON-time described above is set by increasing or decreasing the number of clocks of the writing clock signal, whereby ON and OFF timings of each control signal and signal shape are set. Other aspects of the present embodiment are identical to those in the first writing method.

As described above, electron beam EB is scanned in order to write each element 13 of servo pattern 12. For performing the scanning control of electron beam EB, a write data signal is sent from signal output unit 60 (FIG. 6) to controller 50 of electron beam writing unit 40, which will be described later. The timing and phase of the write data signal are controlled based on an encoder pulse generated according to the rotation of rotation stage 41 and the writing clock signal.

In order to perform the writing described above, fine pattern writing system 20 shown in FIGS. 6A and 6B is used. Fine pattern writing system 20 includes electron beam writing unit 40 and signal output unit 60. Electron beam writing unit 40 includes rotation stage unit 45 having rotation stage 41 and spindle motor 44 having a motor axis aligned with central axis 42 of rotation stage 41; shaft 46 passing through a portion of rotation stage unit 45 and extending in radial direction Y of rotation stage 41; and linear moving means 49 for moving rotation stage unit 45 along shaft 46. Rod 47 with accurate threading and disposed parallel to shaft 46 is screwed to a portion of rotation stage unit 45. Rod 47 is rotatable in the forward and reverse directions by pulse motor 48, and linear moving means 49 of rotation stage unit 45 is formed by rod 47 and pulse motor 48. Further, encoder 53 that generates encoder pulses at regular intervals and predetermined rotation phases by reading encoder slits is installed for detecting the rotation of rotation stage 41, and the encoder pulse signal is outputted to controller 50. Controller 50 further includes a clock unit (not shown) therein that generates the reference clock signal in the timing control.

Electron beam writing unit 40 further includes electron gun 23 that emits electron beam EB, deflection means 21, 22 that deflect electron beam EB in radial direction Y and circumferential direction X, as well as microscopically vibrating the beam back and forth in circumferential direction X or radial direction Y with a predetermined amplitude, and aperture 25 and blanking 26 (deflector) as blanking means 24 for turning the irradiation of electron beam EB ON and OFF. Electron beam EB emitted from electron gun 23 is irradiated on substrate 10 through deflection means 21, 22, a not shown lens, and the like.

Aperture 25 of blanking means 24 has a through hole in the center for passing electron beam EB, and blanking 26 operates according to input of ON/OFF signals, in which it passes electron beam EB through the through hole of aperture 25 during OFF-signal without deflecting the beam, while it blocks electron beam EB with aperture 25 by deflecting the beam so as not to pass through the through hole during ON-signal, so that electron beam EB is not irradiated. Then, while each element 13 is being written, OFF-signal is inputted to irradiate electron beam EB, and ON-signal is inputted during a migration period between elements 13 to block electron beam EB so that exposure is not performed.

Drive control of spindle motor 44, that is, the rotational speed of rotation stage 41, pulse motor driving, that is, the linear movement of linear moving means 49, modulation of electron beam EB, control of deflection means 21, 22, ON/OFF control of blanking 26 of blanking means 24, and the like are performed based on control signals outputted from controller 50 serving as the control means.

Signal output unit 60 stores therein write data of a fine pattern, such as servo patterns 12 and outputs the write data signal to controller 50. Controller 50 performs the associated control described above based on the write data signal, and electron beam writing unit 40 writes servo patterns 12 of the fine pattern on the entire surface of substrate 10.

The proximity-effect control may be implemented by sending a corrected write data signal from signal output unit 60 or performed in the associated control in controller 50.

Substrate 10 to be placed on rotation stage 41 is made of, for example, silicon, glass, or quartz and a positive or negative electron beam writing resist 11 is applied on a surface thereof in advance. Preferably, the power and beam diameter are controlled taking into account the sensitivity of electron beam writing resist 11 and the shape of each element 13.

Figure 7:
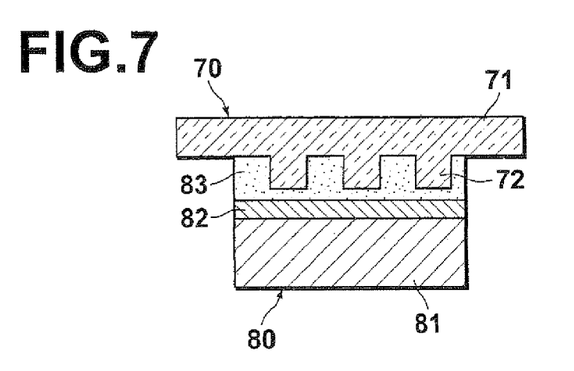
FIG. 7 is a schematic cross-sectional view illustrating a transfer-forming process of a fine pattern on a magnetic disk medium using an imprint mold having a fine pattern written by an electron beam writing method.

FIG. 7 is a schematic cross-sectional view illustrating a process of transfer forming a fine uneven pattern using imprint mold 70 (uneven pattern carrying substrate) having a fine pattern written by the electron beam writing method using fine pattern writing system 20.

Imprint mold 70 is obtained in the following manner. That is, resist 11 (not shown in FIG. 7) is applied on a surface of substrate 71 made of a transparent material and servo patterns 12 are written thereon. Thereafter, resist 11 is processed to form an uneven pattern of the resist on substrate 71. Substrate 71 is etched with the patterned resist as the mask, and then the resist is removed, whereby imprint mold 70 having fine uneven pattern 72 formed thereon is obtained. As an example, fine uneven pattern 72 includes servo patterns and groove patterns for a discrete track medium.

Magnetic disk medium 80 is formed by imprint method using imprint mold 70. Magnetic disk medium 80 includes substrate 81 on which magnetic layer 82 is stacked and resist resin layer 83 for forming a mask layer is provided thereon. The uneven shape of fine uneven pattern 72 is transfer formed by pressing fine uneven pattern 72 of imprint mold 70 against resist resin layer 83 and solidifying resist resin layer 83 by ultraviolet radiation. Thereafter, magnetic layer 82 is etched based on the uneven shape of resist resin layer 83 to form magnetic disk medium 80 of discrete track medium with the fine uneven pattern formed on magnetic layer 82.

The above description is a manufacturing process of a discrete track medium, but a bit pattern medium may also be manufactured through an identical process.

Figure 8A:
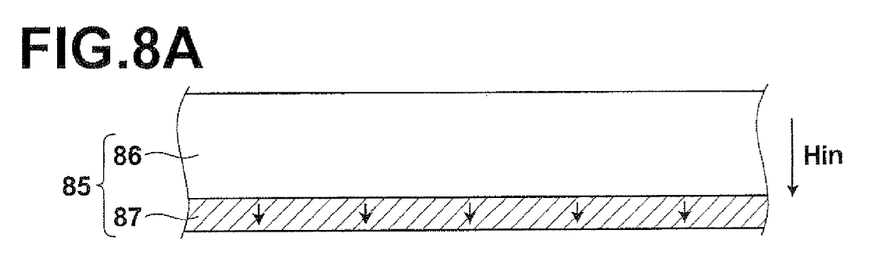
FIGS. 8A and 8B are schematic cross-sectional views illustrating a transfer-forming process of a magnetic pattern on a magnetic disk medium using a magnetic transfer master having a fine pattern written by an electron beam writing method.
Figure 8B:
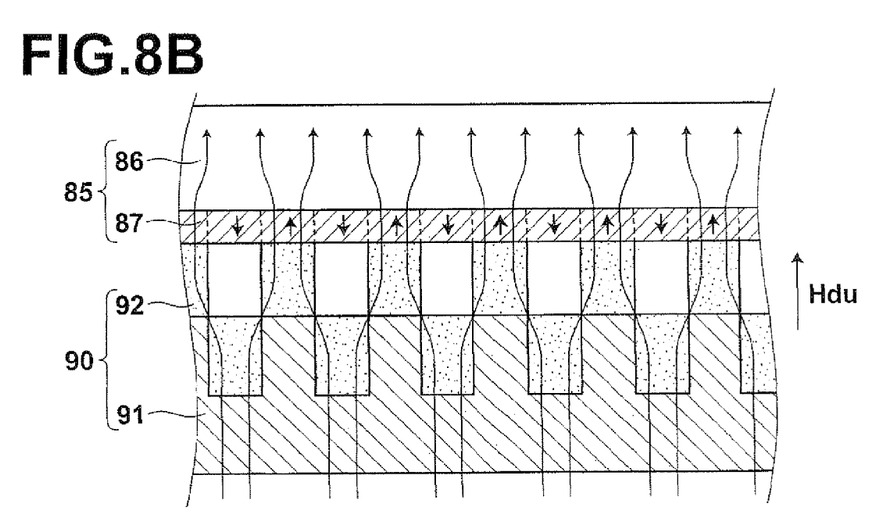

FIGS. 8A and 8B are schematic cross-sectional views illustrating a magnetic transfer process of a magnetic pattern to magnetic disk medium 85 of the present invention using magnetic transfer master substrate 90 (uneven pattern carrying substrate) having a fine pattern written by the electron beam writing method using fine pattern writing system 20.

The manufacturing process of magnetic transfer master substrate 90 is substantially identical to that of imprint mold 70. Substrate 10 to be placed on rotation stage 41 is made of, for example, a silicon, glass, or quartz disk, and positive or negative electron beam writing resist 11 is applied thereon. Then resist 11 is scanned with an electron beam to write a desired pattern thereon. Thereafter, resist 11 is processed to obtain substrate 10 having an uneven pattern of the resist, which is an original master of magnetic transfer master substrate 90.

Next, a thin conductive layer is formed on the surface of the uneven pattern formed on the surface of the original master, and electroforming is performed thereon to obtain substrate 91 having an uneven pattern of metal casting. Thereafter, substrate 91 having a predetermined thickness is peeled off from the original master. The uneven pattern on the surface of substrate 91 is a reverse pattern of the uneven shape of the original master.

After grinding the rear surface of substrate 91, magnetic layer 92 (soft magnetic layer) is stacked on the uneven pattern to obtain magnetic transfer master substrate 90. The shape of a convex portion or concave portion of the uneven pattern on the surface of substrate 91 depends on the uneven pattern of the resist of the original master.

A magnetic transfer method using magnetic transfer master substrate 90 manufactured in the manner as described above will now be described. Magnetic disk medium 85 which is a medium to which information is transferred is, for example, a hard disk, flexible disk, or the like which includes substrate 86 having magnetic recording layer 87 formed on either one of the sides or on both sides. Here, it is assumed to be a vertical magnetic recording medium in which the easy direction of magnetization of magnetic recording layer 87 is perpendicular to the recording surface.

As illustrated in FIG. 8A, initial DC field Hin is applied to magnetic disk medium 85 in a direction perpendicular to the track surface in advance to initially DC-magnetize magnetic recording layer 87. Thereafter, as illustrated in FIG. 8B, magnetic transfer is performed by bringing the surface of magnetic disk medium 85 on the side of recoding layer 87 into close contact with the surface of master substrate 90 on the side of magnetic layer 92 and applying transfer field Hdu in a direction perpendicular to the track surface of magnetic disk medium 85 and opposite to the direction of initial DC field Hin. As the result, the transfer field is drawn into magnetic layer 92 of master substrate 90 and the magnetization of magnetic layer 87 of magnetic recording medium 85 at the portions corresponding to the convex portions of magnetic layer 92 of master substrate 90 is reversed, while the magnetization of the other portions is not reversed. Consequently, information (e.g., servo signal) corresponding to the uneven pattern of master substrate 90 is magnetically transfer recorded on magnetic recording layer 87 of magnetic disk medium 85. Note that, when performing magnetic transfer also to the upper side recording layer of magnetic disk medium 85, the magnetic transfer is performed at the same time with the magnetic transfer of the lower side recording layer by bringing the upper side recording layer and an upper side master substrate into close contact with each other.

In the case of magnetic transfer to a longitudinal magnetic recording medium, master substrate 90 which is substantially the same as that used for the vertical magnetic recording medium is used. For the longitudinal recording medium, the magnetic disk medium is DC-magnetized along a track direction in advance. Then magnetic transfer is performed by bringing the magnetic disk medium into close contact with the master substrate and applying a transfer field in the direction opposite to that of the initial DC magnetization. The transfer magnetic field is drawn into convex portions of the magnetic layer of the master substrate 90 resulting in that the magnetization of the portions of the magnetic layer of the magnetic disk medium corresponding to the convex portions is not reversed while the magnetization of the other portions is reversed. In this way, a magnetic pattern corresponding to the uneven pattern may be recorded on the magnetic disk medium.

The above described manufacturing method of the imprint mold or magnetic transfer master substrate using the electron beam writing method of the present invention is illustrative only. The method is not limited to this and any method may be used as long as it has a process of writing a fine pattern to form an uneven pattern using the electron beam writing method of the present invention.

What is claimed is:

1. An electron beam writing method for writing a fine pattern on a substrate applied with a resist and placed on a rotation stage by scanning an electron beam on the substrate while rotating the rotation stage in one direction, the fine pattern including elements larger than an irradiation diameter of the electron beam, wherein:
   the elements are written by microscopically vibrating the electron beam back and forth in a radial direction of the substrate or in a direction orthogonal to the radial direction and deflecting the electron beam in a direction orthogonal to the vibration direction to scan the electron beam so as to completely fill the shapes of the elements; and
   a proximity-effect correction is performed according to the arrangement density of the elements in which the amount of dose is adjusted by setting the deflection speed faster for the writing of an element in a densely arranged region than for the writing of an identical element in a sparsely arranged region.

2. The electron beam writing method as claimed in claim 1, wherein:
   the rotation of the rotation stage is controlled such that the rotational speed thereof becomes fast for the writing of an inner circumferential track and slow for the writing of an outer circumferential track in inversely proportional to the radius of the writing position, thereby maintaining the linear velocity of the rotation stage constant,
   a writing control signal of the electron beam is generated based on a writing clock signal which is generated in association with the rotation of the rotation stage, and the number of clocks of the writing clock signal in one rotation of the rotation stage is maintained at a constant value for each track regardless of the radius of the writing position, and
   the writing time in the proximity-effect correction is adjusted by increasing or decreasing an integer number of clocks of the writing clock signal.

3. The electron beam writing method as claimed in claim 1, wherein, when the elements are written by microscopically vibrating the electron beam back and forth in a circumferential direction of the substrate and deflecting the electron beam in a radial direction orthogonal to the vibration direction, the proximity-effect correction for an element in the densely arranged region having the same shape as that of an element in the sparsely arranged region is performed such that the element is written by reducing the writing-ON-time and increasing the deflection speed in the radial direction by an amount corresponding to the reduced amount of the writing-ON-time, thereby reduction correcting the amount of dose.

4. The electron beam writing method as claimed in claim 1, wherein, when the elements are written by microscopically vibrating the electron beam back and forth in a radial direction of the substrate and deflecting the electron beam in a circumferential direction orthogonal to the vibration direction, the proximity-effect correction for an element in the densely arranged region having the same shape as that of an element in the sparsely arranged region is performed such that the element is written by reducing the writing-ON-time and increasing the speed of the deflection in the circumferential direction by an amount corresponding to the reduced amount of the writing-ON-time, thereby reduction correcting the amount of dose.

5. A fine pattern writing system for realizing the electron beam writing method as claimed in claim 1, comprising a signal output unit for outputting a write data signal, and an electron beam writing unit for scanning an electron beam.

6. The fine pattern writing system as claimed in claim 5, wherein:
   the electron beam writing unit includes a rotation stage movable in a radial direction while rotating a substrate applied with a resist, an electron gun that emits an electron beam, a deflection means that X-Y deflects the electron beam in a radial direction of the rotation stage and a direction orthogonal to the radial direction and rapidly vibrates the electron beam in the radial direction or in the direction orthogonal to the radial direction, a blanking means that blocks the radiation of the electron beam other than a writing area, and a controller that performs associated control of operation of each of the means;
   the signal output unit is a unit that outputs a write data signal to the controller of the electron beam writing unit based on data corresponding to the form of a fine pattern to be written on the substrate, and wherein
   the controller performs control based on a writing signal which is created based on writing data of the fine pattern to cause a proximity-effect correction to be performed according to the arrangement density of the elements in which the amount of dose is adjusted by setting the deflection speed faster for the writing of an element in a densely arranged region than for the writing of an identical element in a sparsely arranged region.

7. A method for manufacturing an uneven pattern carrying substrate, comprising the steps of:

exposing a desired fine pattern on a substrate applied with a resist by the electron beam writing method as claimed in claim 1; and forming thereon an uneven pattern corresponding to the desired fine pattern.

8. A method for manufacturing a magnetic disk medium, wherein the method uses an imprint mold produced through the steps of exposure writing a desired fine pattern on a substrate applied with a resist by the electron beam writing method as claimed in claim 1 and forming an uneven pattern corresponding to the desired fine pattern on the substrate to transfer an uneven pattern corresponding to the uneven pattern provided on the surface of the mold to the magnetic disk medium.

9. A method for manufacturing a magnetic disk medium, wherein the method uses a magnetic transfer master substrate produced through the steps of exposure writing a desired fine pattern on a substrate applied with a resist by the electron beam writing method as claimed in claim 1 and forming an uneven pattern corresponding to the desired fine pattern on the substrate to transfer a magnetic pattern corresponding to the uneven pattern provided on the surface of the master substrate to the magnetic disk medium.

* * * * *